United States Patent [19]

Fuerherm

[11] 3,950,705
[45] Apr. 13, 1976

[54] NOISE REJECTION METHOD AND APPARATUS FOR DIGITAL DATA SYSTEMS

[75] Inventor: Arthur E. Fuerherm, White Plains, N.Y.

[73] Assignee: Tull Aviation Corporation, Armonk, N.Y.

[22] Filed: Dec. 23, 1974

[21] Appl. No.: 535,732

[52] U.S. Cl. .................. 328/108; 328/63; 328/110; 307/208; 307/232; 307/269
[51] Int. Cl.² ........................................... H03K 5/20
[58] Field of Search .................. 307/208, 232, 269; 328/109, 110, 63

[56] References Cited
UNITED STATES PATENTS

| | | |
|---|---|---|
| 3,263,175 | 7/1966 | Stahl .............................. 307/232 X |
| 3,624,518 | 11/1971 | Dildy, Jr. ............................. 307/208 |
| 3,673,434 | 6/1972 | McIntosh ............................ 307/208 |
| 3,764,920 | 10/1973 | Lange et al. ......................... 328/110 |
| 3,786,276 | 1/1974 | Rosch ................................. 307/208 |

Primary Examiner—Saxfield Chatmon, Jr.
Attorney, Agent, or Firm—Curtis Ailes

[57] ABSTRACT

An input signal is sampled and stored at a first clock interval, and then the stored sample is compared with the input signal at a second clock interval to determine whether the two are the same in order to confirm that the signal is a true signal rather than transient noise.

10 Claims, 2 Drawing Figures

NOISE REJECTION METHOD AND APPARATUS FOR DIGITAL DATA SYSTEMS

This invention relates to a method and apparatus for rejecting noise in digital systems.

One of the most common problems in binary digital data systems is the problem of discriminating true signals from spurious noise signals in situations where the quality of the signals may be marginal in nature and substantial noise signals may be encountered. A typical instance of this kind may be involved when digital data is transmitted over conventional non-dedicated voice quality telephone circuits. For such purposes, it is essential that high frequency transient noise pulses should not be mistaken for genuine digital signals.

Accordingly, it is one important object of the present invention to provide improved digital noise rejection methods and apparatus.

Various solutions have been proposed for the above-mentioned problem. For instance, attention is directed to a prior U.S. Pat. No. 3,790,881 issued to David K. Smith on Feb. 5, 1974 which proposes a system which employs counters and shift registers to determine whether or not an incoming pulse is of acceptable width. However, the circuits of that patent are quite complicated, and are therefore correspondingly expensive.

Therefore, it is another important object of the present invention to provide an improved digital noise rejection method and apparatus which is very simple and economical.

Most digital logic circuits operate on the basis of two different logic states, often referred to as logic 0 and logic 1. These logic states may be signified by different DC voltage levels. For instance, in some of such systems, logic 0 is represented by a nominal DC voltage value of 0, and logic 1 is represented by a nominal DC voltage value of +5 volts. A train of positive pulses at clocked intervals may then signify a train of binary 1 digits, with the absence of such pulses during intervening clock intervals signifying logic 0 digits. Prior digital noise rejection systems have generally concentrated upom distinguishing the individual positive-going pulses of the pulse train, which may signify logic ones, from spurious noise signals. However, such prior systems, such as the system illustrated in the above-mentioned U.S. Pat. No. 3,790,881, do not necessarily reject noise which may be characterized as a departure from the logic 1 state towards the logic 0 state. Thus, such prior systems are not symmetrical in distinguishing true signal state changes from noise where the noise may consist of momentary or transient shifts in potential in either direction.

Accordingly, it is another important object of the present invention to provide a symmetrical digital noise rejection method and apparatus which is operable to reject transient noise signals of either polarity, and to present a clean, noisefree, output.

Another common problem encountered in data handling systems is the problem of synchronizing input signals with the internal clock control of the data handling system. This is particularly important where the signals come in from an outside source such as telephone lines having inherent delays, and origination clock frequencies which may not correspond to the local clock frequency. Typically, this synchronization problem may be taken care of by complicated input buffer storage systems.

Accordingly, it is another important object of the present invention to provide an improved method and apparatus for accomplishing the synchronization of a digital input signal with the local system clock which is very simple, and which preferably is combined with the digital noise rejection function.

Further objects and advantages of the invention will be apparent from the following description and the accompanying drawings.

The invention may be carried out by a method for processing binary digital input signals and for rejecting spurious noise signals and for synchronizing the input signals with a commutator clock comprising the steps of sampling and storing the input signal at a first commutator clock interval, comparing the stored sample signal with the input signal at a second commutator clock interval, and switching one of said compared signals through as the true signal when the comparison verifies that the input signal at said second clock interval corresponds to the stored sample signal.

Figure 1:
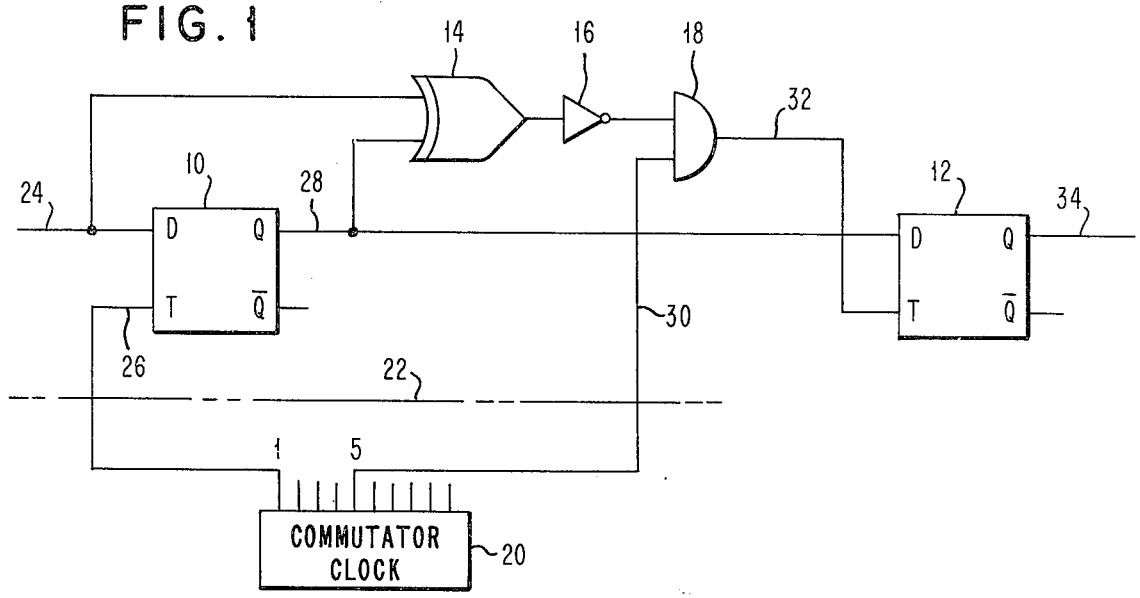
FIG. 1 is a logic circuit diagram of a preferred embodiment of the present invention.

Referring in particular to FIG. 1, the circuit includes two data-type flip-flops, or bistable multivibrator circuits, 10 and 12, an exclusive OR circuit 14, an inverter 16, and a logical coincidence gate 18. The circuit requires the presence of signals from a commutator clock 20 which is shown below the dotted line 22 because the commutator clock 20 may be a part of a larger system. That is, the clock 20 may be the main system clock which controls all of the sequencing functions of the apparatus of which the present circuit constitutes only a small part.

The commutator clock to be used with the circuit of the present invention may have various different signal formats, without altering the principles of circuit operation. However, in one preferred embodiment, the system clock issues a repeating sequence of ten different pulses on different output connections, the sequence of pulses running one through ten and then repeating one through ten over and over. In one such system, the pulses are positive-going pulses (logic ones) and occur at successive intervals of 71 microseconds. That is, the interval from the leading edge of pulse 1 to the leading edge of pulse 2 is 71 microseconds. However, the operation of the circuit of the invention does not require this specific clock interval.

The flip-flops 10 and 12 are the so-called data type flip-flops, each of which includes a trigger input labeled T and a data input labeled D. When a clock pulse is received on the trigger T input, the flip-flop is set if the input signal on the data input D is logic 1. However, if the input at the data input connection is logic 0, the flip-flop is cleared on the receipt of a trigger pulse on terminal T. When the flip-flop is set, a logic 1 output is available on the Q output terminal and a logic 0 is available on the $\overline{Q}$ output terminal. On the other hand, if the flip-flop is cleared, the output is logic 0 from the Q terminal and logic 1 from the $\overline{Q}$ terminal.

The exclusive OR circuit 14 follows the usual exclusive OR truth table. That is, if the two input signals are different, one is logic 1 and the other one is logic 0, the result is a logic 1 output. However, if the two input signals are the same, both logic zeros or both logic ones, the output is logic 0.

The circuit of FIG. 1 operates as follows: The unknown logic input signal appears at connection 24 where it is applied to the data D input of flip-flop 10. The input signal on connection 24 is then sampled and stored at a first clock interval by a signal from the commutator clock 20 which is, for instance, at clock pulse interval 1, and which appears on connection 26 to the trigger input of flip-flop 10. Thus, if the input at 24 is logic 1 at the clock pulse interval one, flip-flop 10 is set, providing a logic 1 output at its Q terminal. On the other hand, if the input signal at 24 is logic 0, the flip-flop 10 is cleared, providing a logic 0 output at the Q output terminal. This output signal is supplied on connection 28 to the data D input terminal of flip-flop 12.

The exclusive OR circuit 14 is connected to receive the resultant sample of the input signal stored in flip-flop 10 and appearing at the output connection 28, and to also receive and compare with that stored sample, the continuing input on input connection 24. As long as these signals are the same, a logic 0 appears at the output of the exclusive OR circuit 14 to the inverter 16. This signal is inverted to a logic 1 by the inverter 16 and supplied to the coincidence gate 18. If this condition continues, such that the stored sample at connection 28 and the input signal at 24 are the same at the time of a second clock pulse (for instance clock pulse 5) appearing on a connection 30 from commutator clock 20, then the coincidence gate 18 provides a logic 1 output pulse on connection 32 to the trigger input of flip-flop 12. This verifies that the input is a true input, and causes flip-flop 12 to assume the same logic state as flip-flop 10, providing an output at an output connection 34 corresponding to the verified input signal.

It is an important feature of the invention that the state of flip-flop 12 will remain the same, regardless of momentary changes in the input signal at 24 and in the state of flip-flop 10, until the input signal has persisted for at least a minimum interval required to first trigger the flip-flop 10 to a new state at the clock pulse 1, and to then verify that the change is not a transient noise signal by the clocking of the comparison circuit including the exclusive OR gate 14, the inverter 16, and the gate 18 at the clock 5 interval by the signal on connection 30. Thus, the output at 34 is quite stable, and all changes in state of the output signal at connection 34 occur at clock pulse 5. Thus, the signal is synchronized with the signals within the system of which the commutator clock 20 forms a part, and sequencing of signal processing can begin with the signal on connection 34 at the clock 5 interval.

The so-called coincidence gate 18 is simply a logic AND gate which provides a logic 1 output only in the presence of two logic 1 inputs. If more convenient, a logic NAND gate (not AND) can be used for this function by the addition of an inverter (not shown) in the line 32 between the gate 18 and the trigger input of flip-flop 12. A NAND gate is the same as an AND gate except it provides an inverted output (logic 0) only in the presence of logic ones at both inputs. Thus, with the inverter, the result is the same at the trigger input of flip-flop 12.

It is quite apparent that once the verification is made that the stored sample at connection 28 and the input signal at connection 24 are the same, it does not really make any difference which of these signals are connected to the data input of flip-flop 12. Thus, the data input connection D of flip-flop 12 could be connected to the input connection 24 rather than to the connection 28, and the circuit would operate in exactly the same manner. However, since the stored sample at the output connection 28 of flip-flop 10 is necessarily more stable than the input signal at connection 24, it is preferred to use the stored sample signal as the input to data terminal D of flip-flop 12. This also avoids presentation of an additional load to the device providing the input signal at connection 24.

Figure 2:
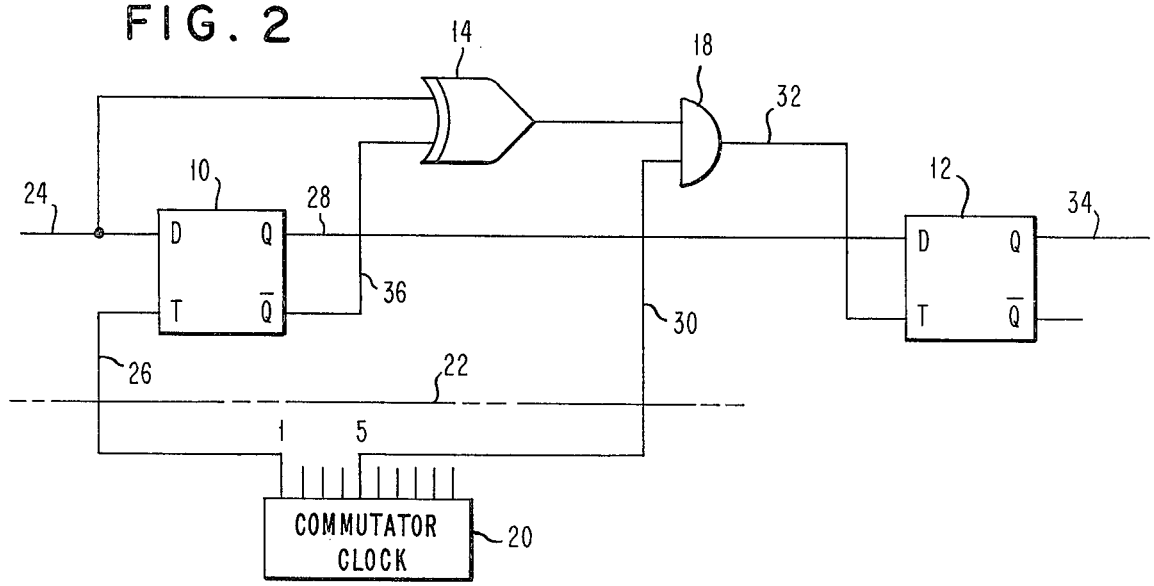
FIG. 2 is a logic circuit diagram of a modification of the embodiment of FIG. 1.

FIG. 2 illustrates a modification of the circuit of FIG. 1. The same parts are given the same numbers. In this modification, the stored sample signal is detected indirectly by connecting the clear output $\overline{Q}$ of flip-flop 10 through a connection 36 as the lower input to exclusive OR gate 14. This provides an inverted indication to the exclusive OR circuit 14 of the nature of the stored sample as it appears on connection 28. The $\overline{Q}$ output is always the inverse of the Q output. By this means, an inverted output is obtained from the exclusive OR gate 14 and the inverter 16 may therefore be eliminated. Thus, when the input at connection 24 and the stored sample appearing at connection 28 are the same, then the inputs to the exclusive OR gate 14 from connection 24 and connection 36 must be different. Under these conditions, and only under these conditions, the exclusive OR gate 14 provides a logic 1 output which can be gated through on connection 32 to trigger and change the state of flip-flop 12.

Each of the circuits may be referred to as a persistence circuit since each determines whether or not the input signal persists for a minimum interval of time. While the interval of persistence which occurs before recognition of the signal as a true signal may vary, depending upon the timing of the initiation of the signal in relation to the sequence of clock signals from the clock 22 the signal must necessarily persist for a minimum interval from the first clock pulse to the second clock pulse. Each of the circuits may also be referred to as a low pass filter since high frequency transients generally are not passed through, but low frequency signals are.

Taking the specific example of the disclosure, in which the time difference from the first clock pulse to the second clock pulse is four pulses on the commutator clock, and assuming that commutator clock pulse intervals are uniformly 71 microseconds, then the minimum interval of duration of the input signal which will be recognized as a true signal will be four times 71 microseconds, or 284 microseconds. Considering that this is representative of one-half cycle of a square wave alternating current input, a full cycle duration would be 568 microseconds, representing a frequency of 1761 Hz. Thus, the circuit will reject any frequency above 1761 Hz.

However, the circuit does not have, and does not require, a specific and unvarying upper cut-off frequency. If the input pulse does not begin just before the first commutator clock pulse, the interval of persistence of the input signal required for recognition is much greater. Assuming the worst case, that the input pulse begins just after the first commutator clock pulse, then a total of 13 clock pulse intervals must intervene until the circuit recognizes the pulse as a true pulse. In the example given, this corresponds to a total one-half cycle period of 923 microseconds and a frequency of 542 Hz. Thus, if the circuit is viewed as a low pass filter, it must be recognized that the upper cut-off frequency varies. In the example given, this variation is over a range from 1761 Hz to 542 Hz.

It is apparent that different cut-off frequencies may be obtained by simply changing the connections to the commutator clock 20, or by employing a different clock having different time intervals.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A method for processing binary digital input signals and for rejecting spurious noise signals and for synchronizing the input signals with a commutator clock comprising the steps of sampling and storing the input signal at a first commutator clock interval, comparing the stored sample signal with the input signal at a second commutator clock interval, and switching one of said compared signals through as the true signal when the comparison verifies that the input signal at said second clock interval corresponds to the stored sample signal.

2. A method as claimed in claim 1 wherein the stored sample signal is switched through as the true signal when the comparison verifies the correspondence.

3. A method as claimed in claim 1 wherein said input signal is asynchronous and all of said signals comprise binary digital signals in which different DC voltage levels signify different binary states.

4. Apparatus for processing binary digital input signals and for rejecting spurious noise signals comprising a commutator clock, means for sampling and storing the input signal at a first clock interval, means for comparing the stored sample signal with the input signal at a second clock interval, and switching means connected for operation in response to said comparison means for switching one of said compared signals through as the true signal when the comparison verifies that the input signal at said second clock interval corresponds to the stored sample signal.

5. Apparatus as claimed in claim 4 wherein said sampling sand storing means comprises a first data type flip-flop, and said switching means comprises a second data type flip-flop.

6. Apparatus as claimed in claim 5 wherein said comparison means comprises an exclusive OR circuit.

7. Apparatus as claimed in claim 6 wherein said comparison means includes a coincidence gate connected to receive the output of said exclusive OR circuit and also connected to receive a second clock interval signal from said commutator clock and having an output connected to said second flip-flop.

8. Apparatus as claimed in claim 7 wherein each of said flip-flops includes a data input and a trigger input and a set output and a clear output, said first flip-flop being arranged to receive the input signal at said data input thereof, said trigger input of said first flip-flop being connected to receive a clock pulse signal at said first clock interval from said commutator clock, said exclusive OR circuit having one of the inputs thereof connected in common with said data input of said first flip-flop to receive said input signal, and said exclusive OR circuit having the other input thereof connected to one of said outputs of said first flip-flop, a connection from the set output of said first flip-flop to the data input of said second flip-flop, and a connection from the output of said coincidence gate to the trigger input of said second flip-flop, the output connection of said circuit comprising the set output of said second flip-flop.

9. Apparatus as claimed in claim 8 wherein said connection from the input of said exclusive OR circuit to an output of said first flip-flop is connected to the set output of said first flip-flop, and a logic inverter is connected between the output of said exclusive OR circuit and the associated input to said coincidence circuit.

10. Apparatus as claimed in claim 8 wherein the input to said exclusive OR circuit from an output of said first flip-flop is connected to the clear output of said first flip-flop.

\* \* \* \* \*

UNITED STATES PATENT AND TRADEMARK OFFICE
CERTIFICATE OF CORRECTION

PATENT NO. : 3,950,705
DATED : April 13, 1976
INVENTOR(S) : ARTHUR E. FUERHERM

It is certified that error appears in the above-identified patent and that said Letters Patent are hereby corrected as shown below:

Column 6, line 4, "said sampling sand storing" should read --said sampling and storing--.

Signed and Sealed this

Twentieth Day of July 1976

[SEAL]

Attest:

RUTH C. MASON
*Attesting Officer*

C. MARSHALL DANN
*Commissioner of Patents and Trademarks*